(12) United States Patent
Hanada et al.

(10) Patent No.: US 12,108,627 B2
(45) Date of Patent: Oct. 1, 2024

(54) DISPLAY DEVICE AND MANUFACTURING METHOD THEREFOR

(71) Applicant: Japan Display Inc., Tokyo (JP)

(72) Inventors: Akihiro Hanada, Tokyo (JP); Kentaro Miura, Tokyo (JP); Hajime Watakabe, Tokyo (JP); Ryo Onodera, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 366 days.

(21) Appl. No.: 17/533,127

(22) Filed: Nov. 23, 2021

(65) Prior Publication Data

US 2022/0165826 A1 May 26, 2022

(30) Foreign Application Priority Data

Nov. 24, 2020 (JP) .................................. 2020-194460

(51) Int. Cl.
*H01L 27/32* (2006.01)
*H01L 51/56* (2006.01)
(Continued)

(52) U.S. Cl.
CPC ....... *H10K 59/1213* (2023.02); *H10K 59/126* (2023.02); *H10K 71/00* (2023.02);
(Continued)

(58) Field of Classification Search
CPC ........... H01L 29/78675; H01L 29/7869; H01L 27/1229; H01L 27/1251; H01L 29/78618–78627; H01L 2029/7863
See application file for complete search history.

(56) References Cited

U.S. PATENT DOCUMENTS

2013/0299819 A1 11/2013 Yamazaki et al.
2016/0013072 A1* 1/2016 Sera .................. H01L 23/53219
257/751
(Continued)

FOREIGN PATENT DOCUMENTS

JP 2003-257989 A 9/2003
JP 2013-254950 A 12/2013
(Continued)

OTHER PUBLICATIONS

Japanese Office Action issued Apr. 23, 2024, in corresponding Japanese Patent Application No. 2020-194460, 8pp.

*Primary Examiner* — Victoria K. Hall
(74) *Attorney, Agent, or Firm* — XSENSUS LLP

(57) ABSTRACT

A display device includes a first transistor having a first semiconductor layer, in which a first source region includes a first region in contact with a first source electrode, and a first drain region includes a second region in contact with a first drain electrode. The first source and drain regions, the first region, and the second region each include a first impurity element. In a region close to an interface between the first semiconductor layer and a first insulating layer, a concentration of the first impurity element included in the first and second regions is higher than a concentration of the first impurity element included in the first source region and the first drain region. A method of manufacturing a display device includes forming a first gate electrode and a light shielding layer on a first insulating layer, and forming a second semiconductor layer on the light shielding layer.

8 Claims, 7 Drawing Sheets

(51) Int. Cl.
*H10K 59/121* (2023.01)
*H10K 59/126* (2023.01)
*H10K 71/00* (2023.01)
*H01L 27/12* (2006.01)
*H01L 29/786* (2006.01)
*H10K 59/12* (2023.01)
*H10K 59/123* (2023.01)

(52) U.S. Cl.
CPC ...... *H01L 27/1225* (2013.01); *H01L 27/1251* (2013.01); *H01L 29/78618* (2013.01); *H01L 29/78633* (2013.01); *H01L 29/78675* (2013.01); *H01L 29/7869* (2013.01); *H10K 59/1201* (2023.02); *H10K 59/123* (2023.02)

(56) References Cited

U.S. PATENT DOCUMENTS

| | | | |
|---|---|---|---|
| 2016/0247831 A1 | | 8/2016 | Makita et al. |
| 2018/0090695 A1 | | 3/2018 | Maruyama |
| 2018/0122955 A1 | * | 5/2018 | Aichi ................. H01L 29/78675 |
| 2019/0006521 A1 | * | 1/2019 | Noh .................... H01L 27/1262 |
| 2020/0259020 A1 | | 8/2020 | Watakabe et al. |

FOREIGN PATENT DOCUMENTS

| | | |
|---|---|---|
| JP | 2018-54677 A | 4/2018 |
| JP | 2020-129635 A | 8/2020 |
| WO | 2015052991 A1 | 4/2015 |
| WO | 2016175086 A1 | 11/2016 |

\* cited by examiner

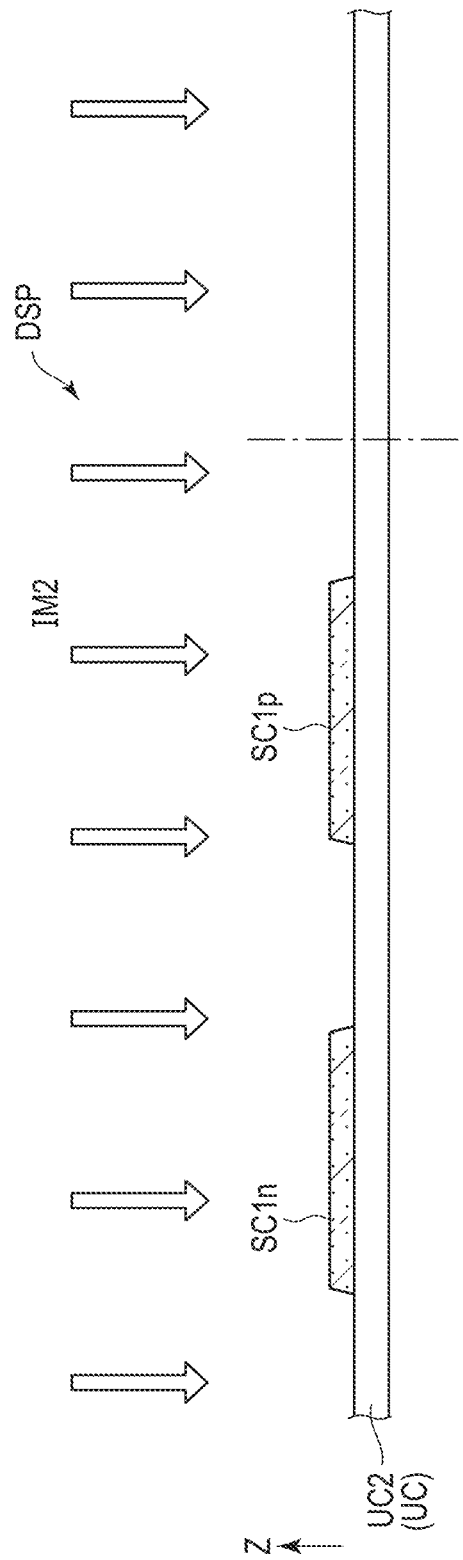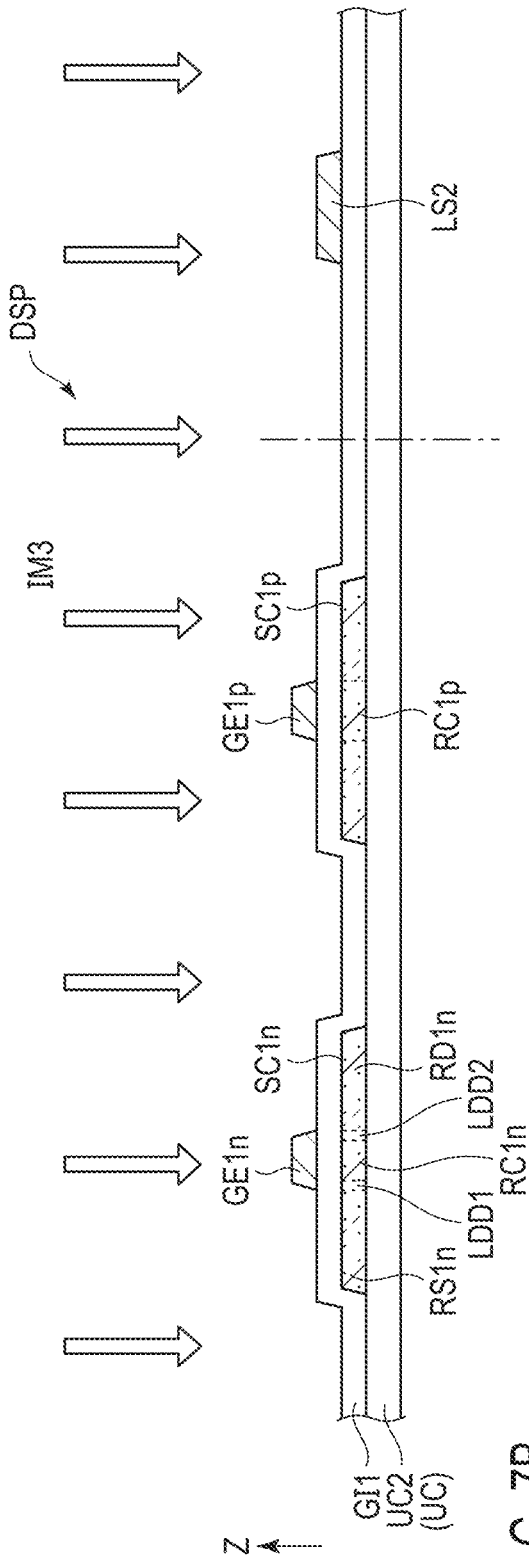

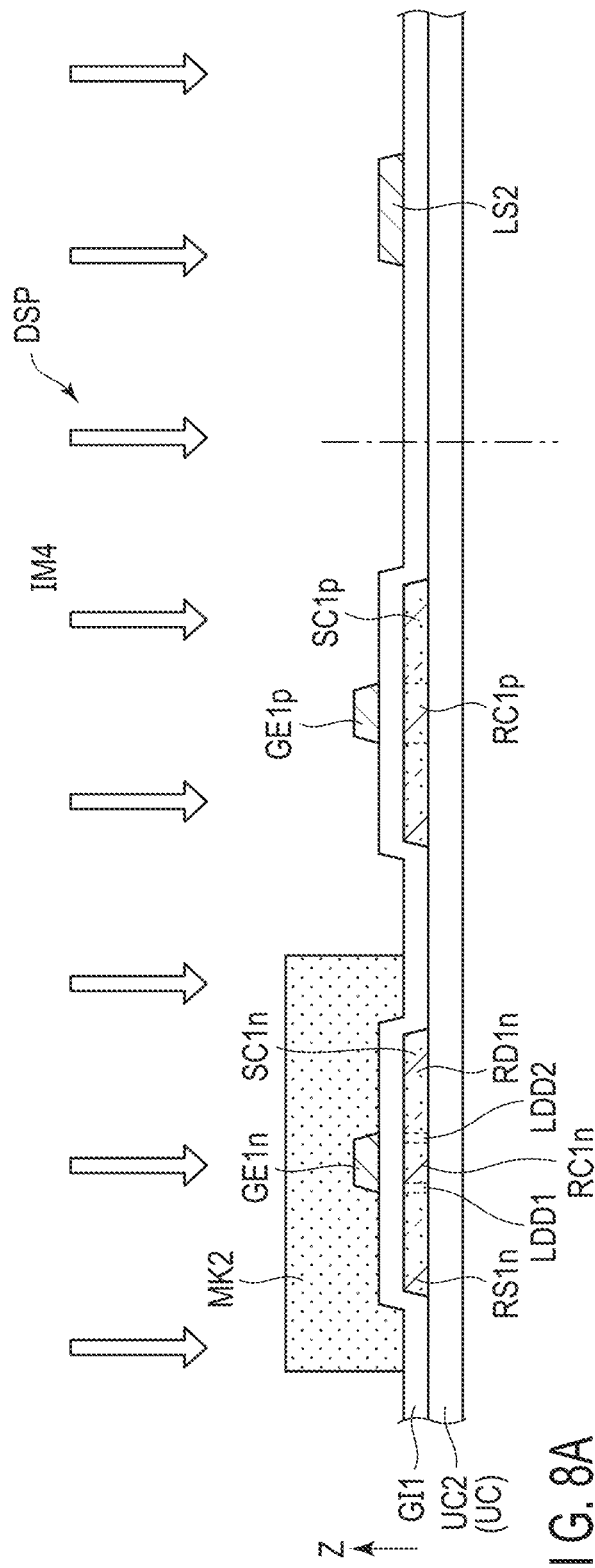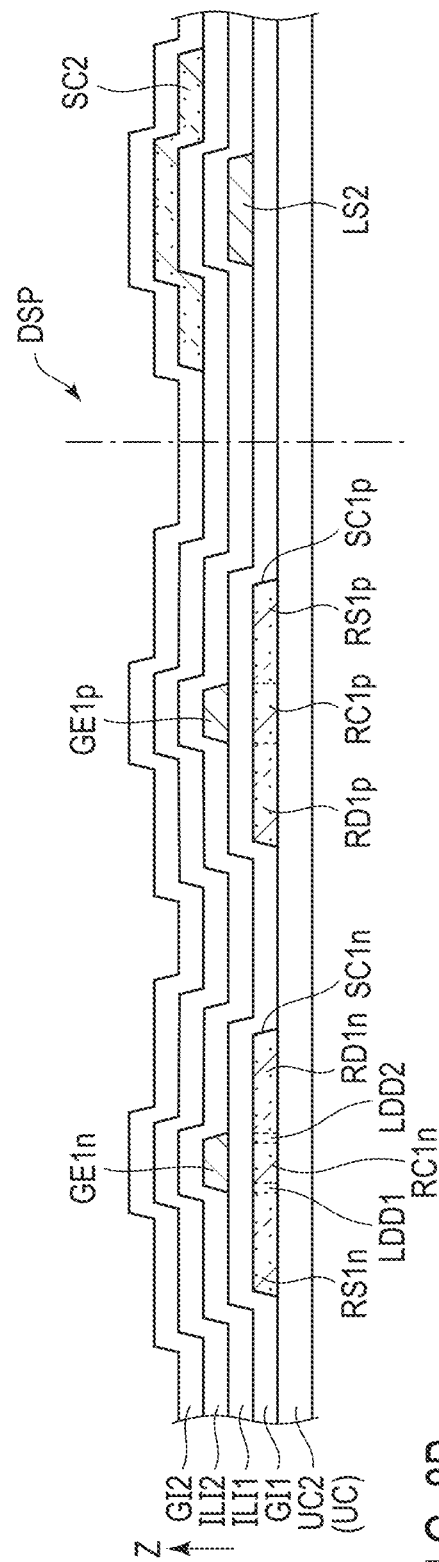
F I G. 8A
F I G. 8B

DISPLAY DEVICE AND MANUFACTURING METHOD THEREFOR

CROSS-REFERENCE TO RELATED APPLICATIONS

This application is based upon and claims the benefit of priority from Japanese Patent Application No. 2020-194460, filed Nov. 24, 2020, the entire contents of which are incorporated herein by reference.

FIELD

Embodiments described herein relate generally to a display device and a manufacturing method therefor.

BACKGROUND

A technique has been proposed, according to which, in a display device, a transistor having an oxide semiconductor is provided in a pixel circuit in a display area and a transistor having a silicon semiconductor is provided in a drive circuit in a peripheral area.

BRIEF DESCRIPTION OF THE DRAWINGS

FIG. 7A is a cross-sectional view showing a process of manufacturing the display device.

FIG. 7B is a cross-sectional view showing a process of manufacturing the display device.

FIG. 8A is a cross-sectional view showing a process of manufacturing the display device.

FIG. 8B is a cross-sectional view showing a process of manufacturing the display device.

DETAILED DESCRIPTION

Figure 1:
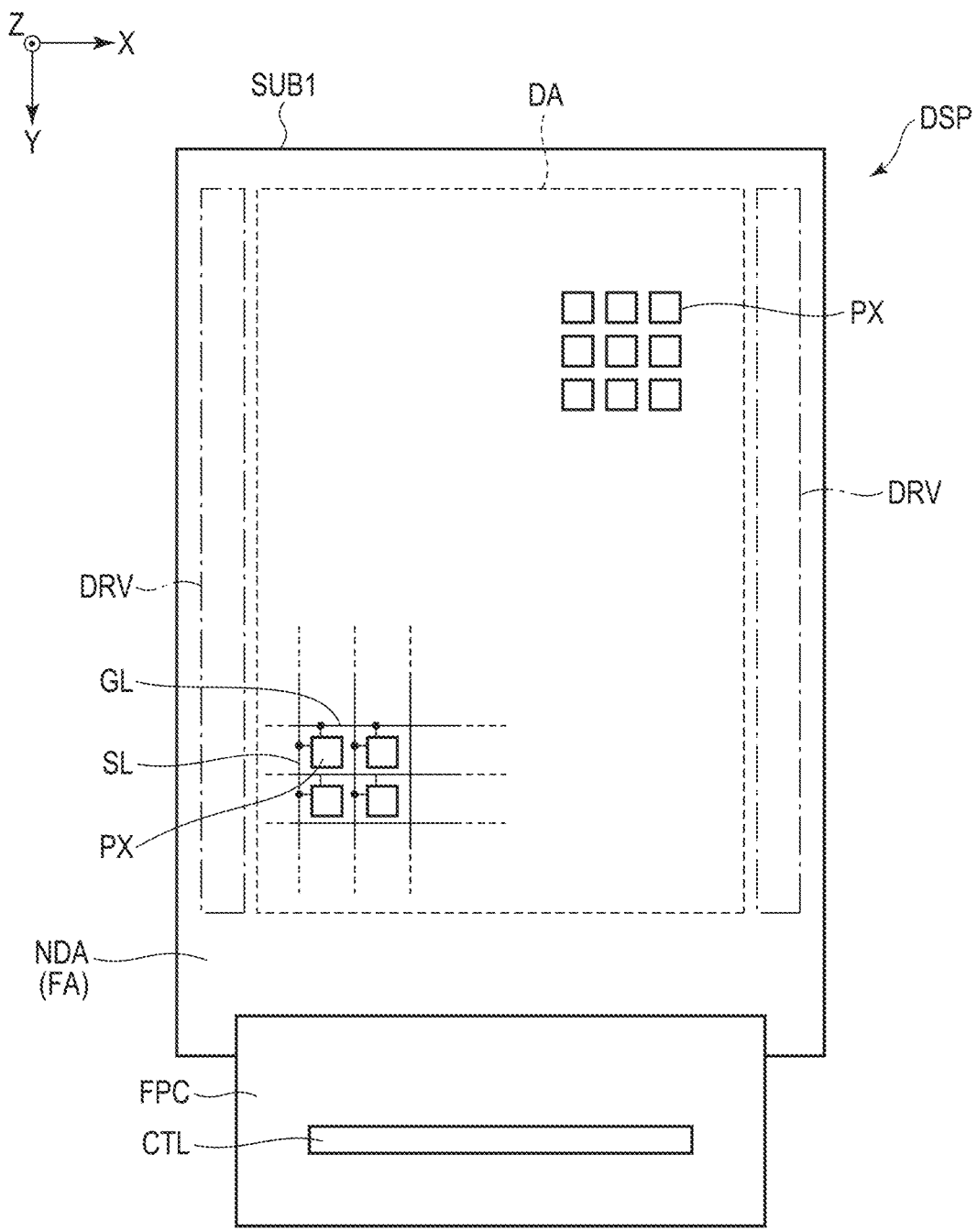
FIG. 1 is a plan view of a display device according to an embodiment.

In general, according to one embodiment, a display device comprises a display area provided with a plurality of pixels; a non-display area provided with a drive circuit that drives the pixels; a first transistor provided in the drive circuit, the first transistor including a first semiconductor layer, a first gate electrode, a first insulating layer provided between the first semiconductor layer and the first gate electrode, a first source electrode, and a first drain electrode; and a second transistor provided in each of the pixels, the second transistor including a second semiconductor layer, a second gate electrode, a second insulating layer provided between the second semiconductor layer and the second gate electrode, a second source electrode, and a second drain electrode, wherein the first semiconductor layer is formed of polycrystalline silicon, and the second semiconductor layer is formed of an oxide semiconductor layer, the first semiconductor layer includes a first channel forming region overlapping the first gate electrode, a first source region, a first drain region, the first source region includes a first region being in contact with the first source electrode, and the first drain region includes a second region being in contact with the first drain electrode, the first source region, the first drain region, the first region, and the second region each include a first impurity element that imparts polarity, and in a region close to an interface between the first semiconductor layer and the first insulating layer, a concentration of the first impurity element included in the first region and the second region is higher than a concentration of the first impurity element included in the first source region and the first drain region.

According to one embodiment, a display device comprises a display area provided with a plurality of pixels; a non-display area provided with a drive circuit that drives the pixels; a first transistor provided in the drive circuit, the first transistor including a first semiconductor layer, a first gate electrode, a first insulating layer provided between the first semiconductor layer and the first gate electrode, a first source electrode, and a first drain electrode; a second transistor provided in each of the pixels, the second transistor including a second semiconductor layer, a second gate electrode, a second insulating layer provided between the second semiconductor layer and the second gate electrode, a second source electrode, and a second drain electrode; and a third insulating layer provided between the first gate electrode and the second semiconductor layer, wherein the first semiconductor layer is formed of polycrystalline silicon, and the second semiconductor layer is formed of an oxide semiconductor layer, the first semiconductor layer includes a first channel forming region overlapping the first gate electrode, a first source region, a first drain region, the first source region includes a first region being in contact with the first source electrode, and the first drain region includes a second region being in contact with the first drain electrode, and the first source region, the first drain region, the first region, the second region, the second semiconductor layer, the first source electrode, the first drain electrode, the second insulating layer, and the third insulating layer each include a first impurity element that imparts polarity.

According to one embodiment, a manufacturing method for a display device, the manufacturing method comprises forming a first semiconductor layer; injecting a first impurity element into the first semiconductor layer; forming a first insulating layer on the first semiconductor layer into which the first impurity element is injected; forming a first gate electrode and a light shielding layer on the first insulating layer such that the first gate electrode and the light shielding layer overlap a part of the first semiconductor layer; injecting a second impurity element into the first semiconductor layer, using the first gate electrode as a mask; forming a second insulating layer such that the second insulating layer covers the first gate electrode, the light shielding layer, and the first insulating layer; forming a second semiconductor layer on the light shielding layer, with the second insulating layer interposed between the light shielding layer and the second semiconductor layer; forming a third insulating layer on the second semiconductor layer and the second insulating layer; forming a first source electrode, a first drain electrode, and a second gate electrode on the third insulating layer, the first source electrode and the first drain electrode being in contact with the first semiconductor layer and the second gate electrode overlapping a part of the second semiconductor layer; and injecting a third impurity element into the first semiconductor layer through the first source electrode and the first drain electrode to form a first region and a second region in the first semiconductor layer.

According to this embodiment, a transistor with improved reliability and a display device with improved display performance can be provided.

Embodiments will be described hereinafter with reference to the accompanying drawings. The disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, similar elements to those described in connection with preceding drawings are denoted by like reference numerals, and a detailed description thereof is omitted unless otherwise necessary.

A display device according to an embodiment will be described hereinafter with reference to the accompanying drawings.

In this embodiment, a first direction X, a second direction Y and a third direction Z are orthogonal to each other, but they may intersect at an angle other than 90 degrees. A direction forwarding a tip of an arrow indicating the third direction Z is referred to as above or "upward" and a direction forwarding oppositely from the tip of the arrow is referred to as below or "downward".

With such expressions "a second member above a first member" and "a second member below a first member", the second member may be in contact with the first member or may be remote from the first member. In the latter case, a third member may be interposed between the first member and the second member. On the other hand, with such expressions "a second member on a first member" and "a second member on a first member", the second member is meant to be in contact with the first member.

In addition, it is assumed that there is an observation position to observe the semiconductor substrate on a tip side of an arrow in the third direction Z, and viewing from this observation position toward the X-Y plane defined by the first direction X and the second direction Y is referred to as a planar view. Viewing a cross section of the semiconductor substrate in an X-Z plane defined by the first direction X and the third direction Z or a Y-Z plane defined by the second direction Y and the third direction Z is referred to as a cross-sectional view.

Embodiment

FIG. 1 is a plan view of a display device according to an embodiment. In a display device DSP shown in FIG. 1, a substrate SUB1 includes a display area DA, a non-display area NDA different from the display area DA, and a drive circuit DRV disposed in the non-display area NDA.

The display area DA includes a plurality of pixels PX, which are arrayed in a matrix.

The non-display area NDA is referred to also as a peripheral area FA encircling the outer periphery of the display area DA. The non-display area NDA includes a wiring board FPC connected to the drive circuit DRV via a terminal (not illustrated). A driver element CTL is disposed on the wiring board FPC. The driver element CTL is provided as, for example, a driver IC.

External signals, such as video signals and various control signals, are supplied to the display device DSP via the wiring board FPC. Video signals are inputted to the pixels PX via the driver element CTL and the drive circuit DRV. More specifically, the drive circuit DRV controls/drives scanning lines GL, signal lines SL, and the like provided in the display area DA, thereby driving the pixels PX.

In the display area DA, a plurality of scanning lines GL and signal lines SL are arranged. The scanning lines GL extend along the first direction X and are lined up in a row along the second direction Y. The signal lines SL extend along the second direction Y and are lined up in a row along the first direction X. The pixels PX are each connected to one of the scanning lines GL and to one of the signal lines SL. The pixels PX are each disposed in an area sectioned off by two signal lines SL and two scanning lines GL. The pixels PX each have a light emitting element. Light emitting elements emit light, based on video signals and various control signals.

Alternatively, pixel having a liquid crystal layer may be provided as the pixel PX.

The pixels PX each have a thin-film transistor (TFT) serving as a control element. The drive circuit DRV too has a thin-film transistor.

The thin-film transistor, which serves as the control element of the pixel PX, should preferably carry a small leak current. This is because that with a small leak current, the voltage level of an incoming image signal can be maintained until the next image signal is inputted. One example of such a thin-film transistor is a thin-film transistor using an oxide semiconductor as an active layer (which is referred to also as an oxide semiconductor transistor or an oxide semiconductor thin-film transistor).

Examples of the oxide semiconductor include indium gallium zinc oxide (IGZO), indium tin zinc oxide (ITZO), zinc oxide nitride (ZnON), and indium gallium oxide (IGO).

The oxide semiconductor carries a small leak current, but its carrier mobility is small, too. In some cases, therefore, the oxide semiconductor is inappropriate for use in a TFT, which needs high-speed drive performance.

A thin-film transistor having polycrystalline silicon (low-temperature polysilicon or LTPS) serving as an active layer, which is referred to also as a polycrystalline silicon transistor or a polycrystalline silicon thin-film transistor, offers high mobility. It is therefore preferable that a thin-film transistor using polycrystalline silicon as an active layer be used as the thin-film transistor included in the drive circuit DRV.

The display device DSP thus includes the thin-film transistor having the oxide semiconductor, as the transistor for the pixel PX, and uses the thin-film transistor having the polycrystalline silicon, as the transistor for the drive circuit DRV, and such a display device DSP achieves both effects: less leak current and high-speed drive performance. In this embodiment, the thin-film transistor having polycrystalline silicon is referred to also as a first thin-film transistor or a first transistor, and the thin-film transistor having the oxide semiconductor layer is referred to also as a second thin-film transistor or a second transistor.

Figure 2:
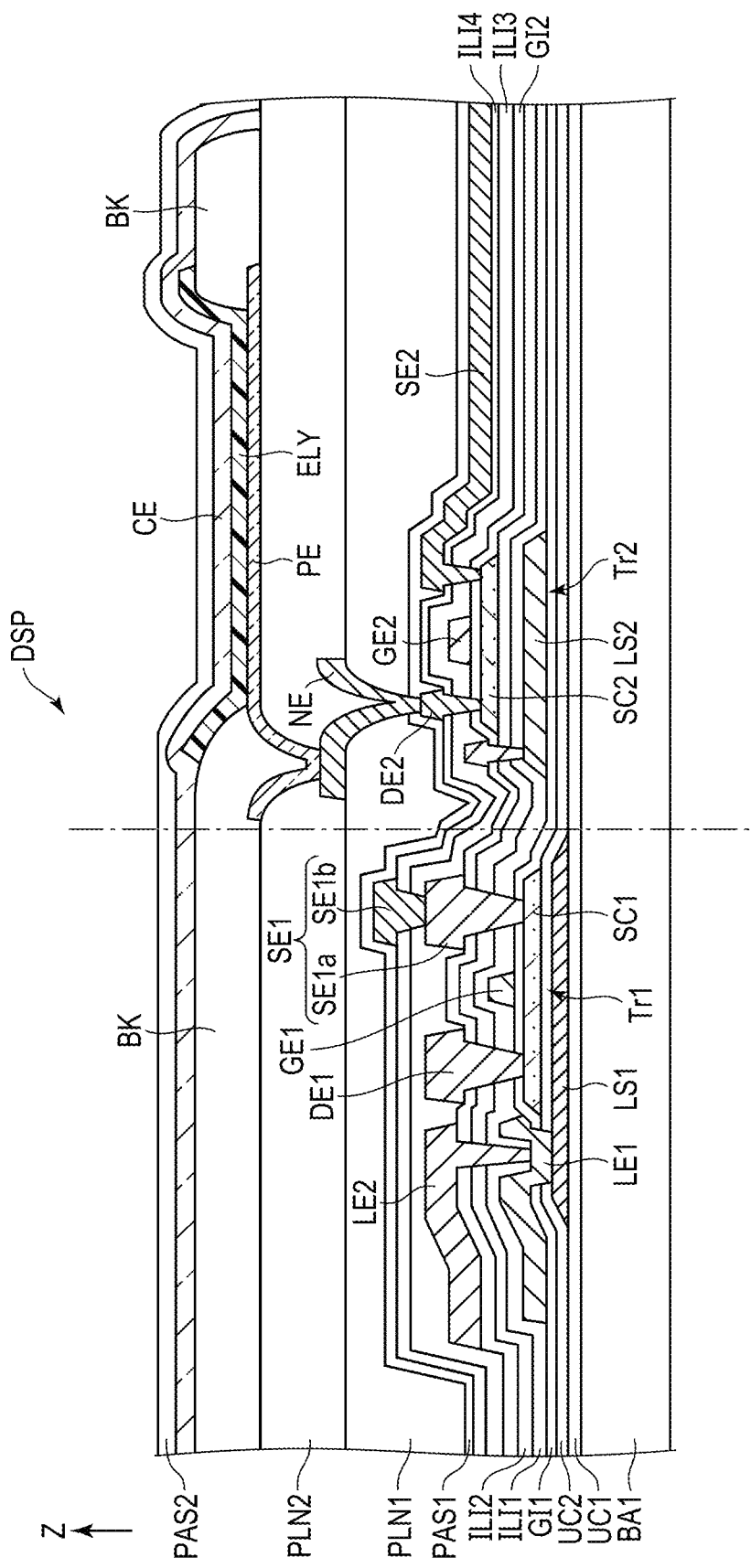
FIG. 2 is a conceptual cross-sectional view of the display device of the embodiment.

FIG. 2 is a conceptual cross-sectional view of the display device of the embodiment. To make the drawing easier to see, some components are left unhatched. The display device DSP shown in FIG. 2 includes a base BA1, an insulating layer UC1, a light shielding layer LS1, an insulating layer UC2, a transistor Tr1, an insulating layer ILI1, an insulating layer ILI2, a transistor Tr2, an insulating layer ILI3, an insulating layer ILI4, an insulating layer PAST, an insulating layer PLN1, a connection electrode NE, an insulating layer PLN2, a pixel electrode PE, an organic EL layer ELY, a common electrode CE, and an insulating layer PAS2.

The transistor Tr1 and the transistor Tr2 correspond respectively to the first thin-film transistor and the second thin-film transistor. In other words, the transistor Tr1 is the polycrystalline silicon transistor, and the transistor Tr2 is the oxide semiconductor transistor.

The base BA1 is made of glass or resin. The resin used as the base BA1 is, for example, a polyimide resin, an acrylic resin, or the like.

The insulating layer UC1 blocks impurities diffusing from glass or the like, and is formed of, for example, a single layer of silicon oxide or silicon nitride or stacked layers of silicon oxide and silicon nitride.

The light shielding layer (also called as light blocking layer) LS1 has a function of shielding a semiconductor layer of the transistor Tr1 from light. When the light shielding layer LS1 is a metal layer, the light shielding layer LS1 may function as a back gate of the transistor Tr1. It can be said, in such a case, that the light shielding layer LS1 is included in the transistor Tr1.

On the light shielding layer LS1 and the insulating layer UC1, the insulating layer UC2 is provided. The insulating layer UC2 is made of the same material as the insulating layer UC1.

On the insulating layer UC2, a semiconductor layer SC1 is provided, which is an active layer of the transistor Tr1. The semiconductor layer SC1 is formed of the above-described polycrystalline silicon. The semiconductor layer SC1 may be referred to as a first semiconductor layer or a polycrystalline silicon layer.

The semiconductor layer SC1 has a channel forming region overlapping a gate electrode GE1, a source region overlapping a source electrode SE1, which will be described later, and a drain region overlapping a drain electrode DE1, which will be described later.

On the semiconductor layer SC1 and the insulating layer UC2, an insulating layer GI1 is provided. The insulating layer GI1 is formed of, for example, silicon oxide. The insulating layer GI1 is a gate insulating layer of the transistor Tr1.

On the insulating layer GI1, the gate electrode GE1 of the transistor Tr1, an electrode LE1, and a light shielding layer LS2 are provided. In other words, the insulating layer GI1 is provided between the semiconductor layer SC1 and the gate electrode GE1. The gate electrode GE1, the electrode LE1, and the light shielding layer LS2 are formed of, for example, a laminate in which a molybdenum-tungsten alloy (MoW) or an aluminum alloy is sandwiched between titanium layers.

The electrode LE1 is connected to the light shielding layer LS1 via a contact hole formed on the insulating layers UC2 and GI1. When the light shielding layer LS1 functions as the back gate of the transistor Tr1, as mentioned above, a signal is input via the electrode LE1.

The light shielding layer LS2 shields an active layer of the transistor Tr2 from light. The light shielding layer LS2 may function as a back gate of the transistor Tr2. It can be said, in such a case, that the light shielding layer LS2 is included in the transistor Tr2.

On the insulating layer GI1, the insulating layer ILI1 is provided to cover the gate electrode GE1, the electrode LE1, and the light shielding layer LS2. The insulating layer ILI1 is formed of, for example, silicon nitride.

On the insulating layer ILI1, the insulating layer ILI2 is provided. The insulating layer ILI2 is formed of, for example, silicon oxide. The insulating layers ILI1 and ILI2 function as inter-layer insulating layers of the transistor Tr1. The insulating layers ILI1 and ILI2 function also as insulating layers for insulating the light shielding layer LS2 and the semiconductor layer SC2 from each other.

On the insulating layer ILI2, the semiconductor layer SC2 is provided to overlap the light shielding layer LS2. The semiconductor layer SC2 is formed of the above-mentioned oxide semiconductor. The semiconductor layer SC2 may be referred to also as a second semiconductor layer or an oxide semiconductor layer.

The semiconductor layer SC2 has a channel forming region overlapping a gate electrode GE2, a source region overlapping a source electrode SE2, which will be described later, and a drain region overlapping a drain electrode DE2, which will be described later. The gate electrode GE2 is electrically connected to the scanning line GL. The gate electrode GE2 may be formed integrally with the scanning line GL.

On the semiconductor layer SC2 and the insulating layer ILI2, an insulating layer GI2 is provided. The insulating layer GI2 is formed of, for example, silicon oxide or silicon oxide containing nitrogen. The insulating layer GI2 functions as a gate insulating layer of the transistor Tr2. It can be said that the semiconductor layer SC2 is provided between the insulating layer ILI2 and the insulating layer GI2.

On the insulating layer GI2, the gate electrode GE2 is provided to overlap the channel forming region of the semiconductor layer SC2, a source electrode SE1a is provided to overlap the source region of the semiconductor layer SC1, and an electrode LE2 is provided to overlap the drain region of the semiconductor layer SC1 and connect to the drain electrode DE1 and the electrode LE1. In other words, the insulating layer GI2 is provided between the semiconductor layer SC2 and the gate electrode GE2. The gate electrode GE2, the source electrode SE1a, the drain electrode DE1, and the electrode LE2 are each formed of, for example, a laminated film in which an aluminum alloy layer is sandwiched between titanium films, of a molybdenum layer, or of an alloy layer including molybdenum and tungsten.

The insulating layer ILI3 is provided to cover the insulating layer GI2, the gate electrode GE2, the source electrode SE1a, the drain electrode DE1, and the electrode LE2. On the insulating layer ILI3, the insulating layer ILI4 is provided. The insulating layers ILI3 and ILI4 are each formed of silicon nitride and silicon oxide.

On the insulating layer ILI4, a source electrode SE1b is provided to connect to the source electrode SE1a, the source electrode SE2 is provided to overlap the source region of the semiconductor layer SC2, and the drain electrode DE2 is provided to overlap the drain region of the semiconductor layer SC2. The source electrode SE1b, the source electrode SE2, and the drain electrode DE2 are each formed of, for example, a laminated film in which an aluminum alloy layer is sandwiched between titanium films.

The source electrodes SE1a and SE1b are combined to form the source electrode SE1. The source electrode SE1b may be formed integrally with the signal line SL. The source electrode SE1 (the source electrodes SE1a and SE1b) may be formed integrally with the signal line SL.

The insulating layer PAS1 is provided to cover the insulating layer ILI4, the source electrode SE1b, the source electrode SE2, and the drain electrode DE2. The insulating layer PAS1 is formed of, for example, silicon oxide.

The insulating layer PLN1 is provided to cover insulating layer PAS1. The insulating layer PLN1 is formed of an organic insulating material, such as polyimide.

On the insulating layer PLN1, the connection electrode NE connected to the drain electrode DE2 is provided. The connection electrode NE is formed of, for example, a laminated film in which an aluminum alloy layer is sandwiched between titanium films. This embodiment has been described as a configuration including the connection electrode NE, but the embodiment is not limited to such a configuration. A different configuration not including the connection electrode NE may be adopted, in which the pixel electrode PE, which will be described later, is directly connected to the drain electrode DE2.

The insulating layer PLN2 is provided to cover the insulating layer PLN1 and the connection electrode NE. The insulating layer PLN2 is formed of an organic insulating material, such as polyimide. The insulating layers PLN1 and PLN2 have a function of planarizing the irregular surface of the substrate SUB1, the irregular surface being formed by the transistors or the like.

On the insulating layer PLN2, the pixel electrode PE connected to connection electrode NE is provided. As described above, the pixel electrode PE may be connected to the drain electrode DE2.

The pixel electrode PE may be of a laminated structure including a first conductive layer having reflectivity and a second conductive layer having translucency. For example, silver (Ag) and indium zinc oxide (IZO) are used as materials that form the first conductive layer and the second conductive layer, respectively, and the pixel electrode PE may be of a laminated structure in which an IZO layer, an Ag layer, and an IZO layer are stacked in this order.

A bank BK (which is referred to also as a protrusion, a rib, or a partition) is provided between pixel electrodes PE adjacent to each other. The same organic material as the insulating layers PLN1 and PLN2 is used as the material of the bank BK. The bank BK has an opening where a part of the pixel electrode PE is exposed. It is preferable that the edge of the opening OP be gently sloped. The edge of the opening in a steeply sloped shape causes the organic EL layer ELY, which will be formed later, a problem of inferior coverage.

The organic EL layer ELY is provided between adjacent banks BK to overlap the pixel electrodes PE. The organic EL layer ELY includes a hole-injection layer, a hole-transport layer, an electron blocking layer, a light-emitting layer, a hole blocking layer, an electron-transport layer, an electron-injection layer, and the like. In this specification, the organic EL layer ELY is referred to also as an organic material layer. The organic EL layer ELY includes at least the light-emitting layer, and additionally includes other layers on a necessary basis.

The common electrode CE is provided to cover the organic EL layer ELY and the bank BK. The common electrode CE may include, for example, a first layer and a second layer. The second layer may have transmittance higher than that of the first layer. For example, as the first layer, a thin film of magnesium-silver alloy (MgAg) or ytterbium-silver alloy (YbAg) may be formed. As the second layer, a transparent electrode, such as indium tin oxide (ITO) or indium zinc oxide (IZO), is formed.

In this embodiment, the pixel electrode PE serves as an anode while the common electrode CE serves as a cathode. Light generated in the organic EL layer ELY is emitted upward. This means that the display device DSP has a top emission structure.

The insulating layer PAS2 is provided to cover the common electrode CE. The insulating layer PAS2 has a function of preventing moisture from entering the organic EL layer ELY and has an optical adjustment function as well. These functions will be descried in detail later. A layer with a high gas barrier property is preferable as the insulating layer PAS2. The insulating layer PAS2 may be, for example, a stack of an organic insulating layer and an inorganic insulating layer containing nitrogen. Another example of the insulating layer PAS2 is an insulating layer in which an organic insulating layer is sandwiched between two inorganic insulating layers containing nitrogen. Still another example of the insulating layer PAS2 is a structure including two inorganic insulating layers stacked together. The material of the above organic insulating layer is acrylic resin, epoxy resin, polyimide resin, or the like. The material of the nitrogen-containing inorganic insulating layer is, for example, silicon nitride, aluminum nitride, or the like.

The insulating layer PAS2 may be further overlaid with an organic resin layer or with a base BA2 opposite to the base BA1, the organic resin layer and base BA2 being not illustrated.

Figure 3:
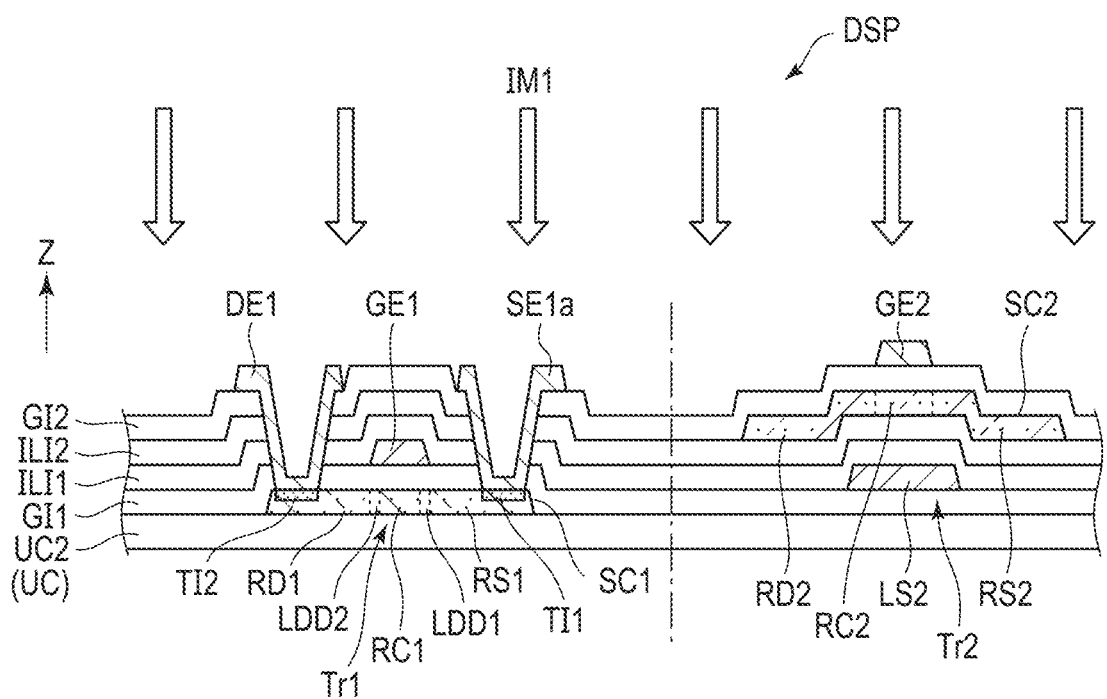
FIG. 3 is a partial cross-sectional view of the display device of the embodiment.

FIG. 3 is a partial cross-sectional view of the display device of the embodiment. To make the drawing easier to see, some components are omitted or left unhatched. As described above, the transistor Tr1 is the polycrystalline silicon transistor, and the transistor Tr2 is the oxide semiconductor transistor.

The semiconductor layer SC1 includes a channel forming region RC1, a source region RS1, and a drain region RD1. A low-concentration impurity region (which is referred to also as a lightly doped drain or LDD) LDD1 is provided between the channel forming region RC1 and the source region RS1 while a low-concentration impurity region LDD2 is provided between the channel forming region RC1 and the drain region RD1. The low-concentration impurity regions LDD1 and LDD2 each have an impurity concentration lower than that of the drain region RD1. The impurity concentration of the drain region RD1 is equal to that of the source region RS1. This means that the impurity concentration of the low-concentration impurity regions LDD1 and LDD2 is lower than that of the source region RS1. It should be noted, however, that the low-concentration impurity regions LDD1 and LDD2 may be not formed. An impurity element injected in the low-concentration impurity regions is an impurity element that imparts polarity to the transistor Tr1, and the type of the impurity element will be described later.

The semiconductor layer SC2 includes a channel forming region RC2, a source region RS2, and a drain region RD2.

A region TI1 is provided in a sub-region of source region RS1 that is in contact with the source electrode SE1$a$ (SE1) while a region TI2 is provided in a sub-region of drain region RD1 that is in contact with the drain electrode DE1. Close to an interface between the semiconductor layer SC1 and the insulating layer GI1, the impurity concentration of the region TI1 is higher than that of the other sub-region of source region RS1 where the region TI1 is not formed. This will be described in detail later. Close to the interface between the semiconductor layer SC1 and the insulating layer GI1, the impurity concentration of the region TI2 is higher than that of the other sub-region of drain region RD1 where the region TI2 is not formed. Forming the regions TI1 and TI2 with high impurity concentration in the sub-regions in contact with the source electrode SE1$a$ and the drain electrode DE1, respectively, suppresses an increase in contact resistance between the source electrode SE1$a$ and drain electrode DE1 and the semiconductor layer SC1.

An impurity element in the regions TI1 and TI2 is the same as an element in the source region RS1 and the drain region RD1. When the transistor Tr1 is an n-channel transistor, the impurity element may be, for example, phosphorus (P). When the transistor Tr1 is a p-channel transistor, the impurity element may be, for example, boron (B).

The regions TI1 and 112 are formed by injecting an impurity element IM1 into the semiconductor layer SC1 through the source electrode SE1a and the drain electrode DE1 in contact holes for making electrical contact with the semiconductor layer SC1. In the transistor Tr1, the insulating layers GI1, ILI1, ILI2, and GI2 are present in a region where the above contact holes are not formed. In this region, therefore, the impurity element IM1 fails to reach a deep point where the semiconductor layer SC1 is present, and, consequently, is not injected into the semiconductor layer SC1. In other words, the maximum concentration of the impurity element IM1 lies in the regions TI1 and TI2. In the region of semiconductor layer SC1 that does not include the regions TI1 and TI2, in contrast, the impurity element IM1 is not injected.

Meanwhile, in a region of transistor Tr2 where the gate electrode GE2 is present, the gate electrode GE2 and the insulating layer GI2 serve as a mask. In this region, therefore, the impurity element IM1 is not injected into the semiconductor layer SC2. This region into which no impurity element IM1 is injected serves as the channel forming region RC2. In a region where the gate electrode GE2 is not present, on the other hand, the impurity element IM1 is injected into the semiconductor layer SC2 through the insulating layer GI2. In other words, the impurity element IM1 is injected to maximize its concentration in the semiconductor layer SC2. The region of semiconductor layer SC2 where the impurity element IM1 is injected serve as the source region RS2 and the drain region RD2.

To cause the impurity element IM1 to take such a concentration distribution, an applied voltage for impurity injection is adjusted. The concentration of the impurity element IM1 in the above injection process is defined as concentration CN1. The concentration of the impurity element IM1 in the regions TI1 and TI2 is defined as concentration CT1.

In the semiconductor layer SC1, a region where carriers (electrons or holes) flow is located close to the interface between the semiconductor layer SC1 and the insulating layer GI1. In the regions TI1 and TI2, as described above, the maximum concentration of the impurity element IM1 lies close to the interface between the semiconductor layer SC1 and the insulating layer GI1. In contrast, in the sub-regions of source region RS1 and drain region RD1 where the source electrode SE1a and the drain electrode DE1 are not present, respectively, that is, the sub-regions not including the region TI1 and the region TI2, respectively, the concentration of the impurity element IM1 close to the interface between the semiconductor layer SC1 and the insulating layer GI1 is lower than that of the regions TI1 and TI2. This is because that, as described above, the impurity element IM1 does not reach the deep point where the semiconductor layer SC1 is present.

The above injection process is carried out also as a termination process on the insulating layer GI2 formed of silicon oxide. There is a concern that the reliability of the semiconductor layer SC2 may be reduced because of defect levels present in the insulating layer GI2. The defect levels develop mainly due to excess oxygen in silicon oxide. Such a defect functions as an electron trap when the transistor Tr2 is on operation. As a result, the reliability of the transistor Tr2 decreases.

A hydrogen-based termination process may be used to repair defects in the insulating layer GI2. However, in the transistor Tr2, which is the oxide semiconductor transistor, excess hydrogen may deplete a threshold Vth significantly. An extreme shift (depletion) of the threshold Vth may cause an operation failure of the display device DSP including the transistor Tr2. For the display device DSP, therefore, the hydrogen-based termination process on the insulating layer GI2 is not preferable.

In this embodiment, the termination process on the insulating layer GI2 is carried out using the impurity element IM1, such as phosphorus or boron, in place of hydrogen.

As described above, the resistance of the semiconductor layer SC2 can be reduced by the injection process. Injecting the impurity element into the semiconductor layer SC2, i.e., the oxide semiconductor, creates a defect level in the semiconductor layer SC2. As a result, the resistance of the semiconductor layer SC2 can be reduced.

Figure 4:
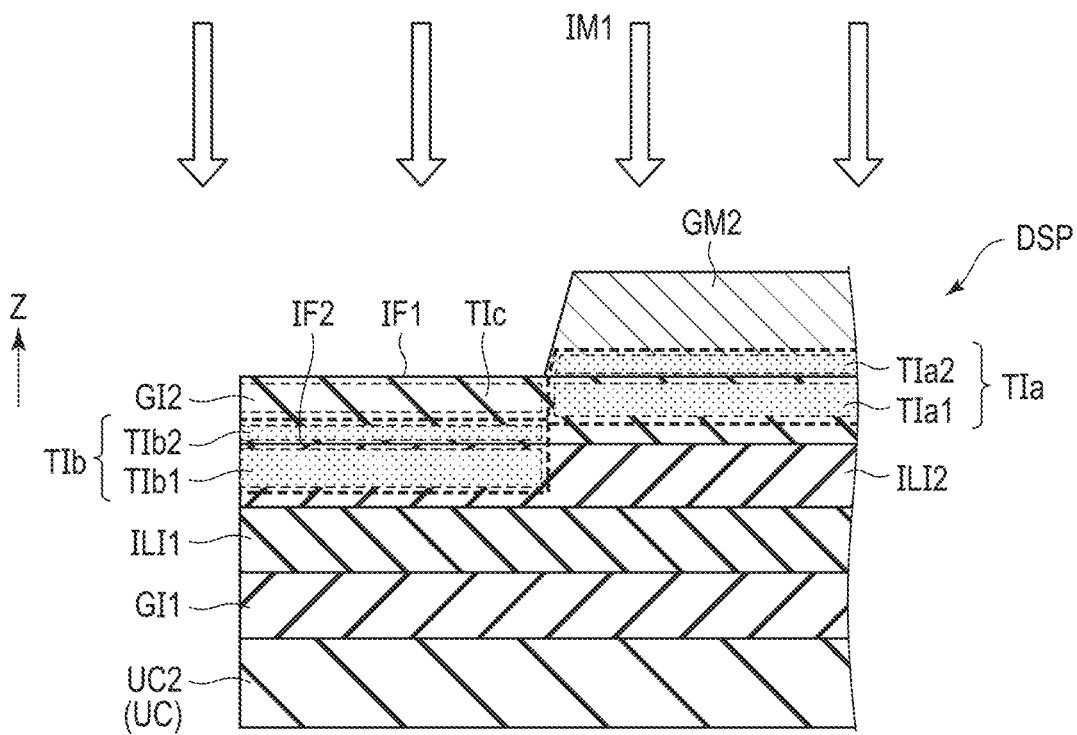
FIG. 4 is a partial cross-sectional view of the display device of the embodiment.

FIG. 4 is a partial cross-sectional view of the display device of the embodiment. In FIG. 4, the gate electrode GE2, the source electrode SE1a, and the drain electrode DE1 are collectively illustrated as a metal layer GM2. FIG. 4 is a cross-sectional view of a region where the semiconductor layer SC2 is not provided.

In the process of injecting the impurity element IM1, the impurity element IM1 is injected through the metal layer GM2 in a region where the metal layer GM2 is provided. A region TIa2 containing the impurity element IM1 is formed in a part of the metal layer GM2, and a region TIa1 containing the impurity element IM1 is formed in a part of insulating layer GI2 that overlaps the metal layer GM2.

An interface between the metal layer GM2 and the insulating layer GI2 is denoted as IF1, and an interface between the insulating layer GI2 and the insulating layer ILI2 is denoted as IF2. The region TIa2 forming a part of the metal layer GM2 is located near the interface IF1. The region TIa1 forming a part of the insulating layer GI2 is located near the interface IF1.

In a region where the metal layer GM2 is not provided, a region TIb1 containing the impurity element IM1 is formed in a part of the insulating layer ILI2 while a region TIb2 containing the impurity element IM1 is formed in a part of the insulating layer GI2. The region TIb1 forming a part of the insulating layer ILI2 is located close to the interface IF2. The region TIb2 forming a part of the insulating layer GI2 is located close to the interface IF2.

When the semiconductor layer SC2 is provided between the insulating layer ILI2 and the insulating layer GI2 (see FIG. 3), the region TIb1 is formed in the semiconductor layer SC2, which is, however, not shown in FIG. 4. In this case, the description of the regions TIb1 and TIb2 should be understood with the insulating layer ILI2 being interpreted as the semiconductor layer SC2.

The regions TIa1 and TIa2 are collectively referred to as a region TIa. The regions TIb1 and TIb2 are collectively referred to as a region TIb. The regions TIa and TIb each contain the impurity element IM1. The impurity element IM1 is, for example, boron. However, as in the case of FIG. 3, the impurity element IM1 may be phosphorus.

To inject the impurity element IM1 into the insulating layer GI2 through the metal layer GM2, the injection process should be carried out by applying a voltage high enough to cause the impurity element IM1 to penetrate the thickness of the metal layer GM2. When the impurity element IM1 is injected with such an applied voltage, the following thing happens in the insulating layers ILI2 and GI2 in the region where the metal layer GM2 is not provided: the maximum concentration of the impurity element IM1 lies in a part separated away from the interface between the metal layer GM2 and the insulating layer GI2 in the direction opposite to the third direction Z (which direction is referred to also as a depth direction).

In other words, the region TIa includes the interface IF1, and the region TIb includes the interface IF2. The region TIa is located above the region TIb in the third direction Z.

When a region of insulating layer GI2 that is above the region TIb and does not overlap the metal layer GM2 is defined as a region TIc, the impurity concentration of the region TIc is lower than that of the region TIb. The impurity concentration of the region TIc is also lower than that of the region TIa.

As shown in FIGS. 3 and 4, the source region RS1, the drain region RD1, the region TI1, and the region TI2 of the semiconductor layer SC1 of the transistor Tr1, and the source electrode SE1a and the drain electrode DE1 each contain the impurity element IM1.

The semiconductor layer SC2, the insulating layer GI2, and the gate electrode GE2 of the transistor Tr2 each contain the impurity element IM1.

The insulating layer ILI2 disposed between the transistor Tr1 and the transistor Tr2 contains the impurity element IM1.

Figure 5A:
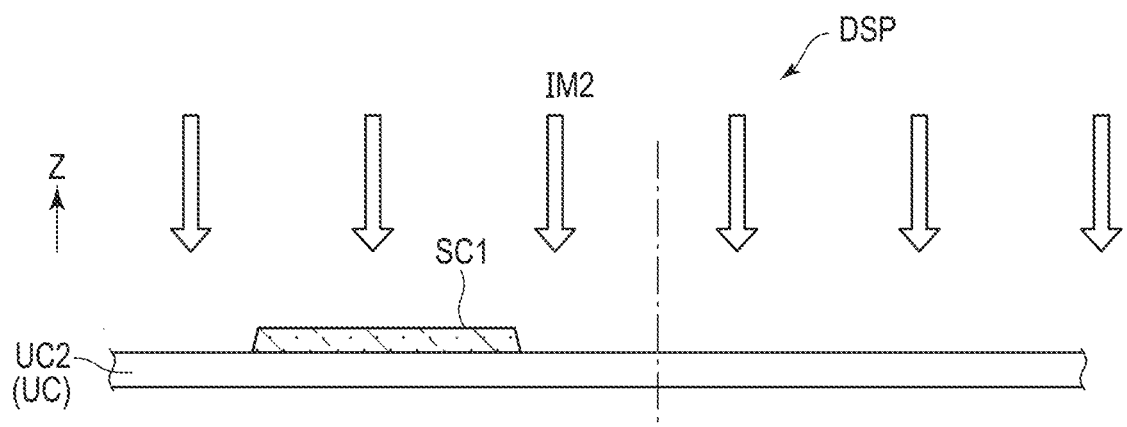
FIG. 5A is a cross-sectional view showing a process of manufacturing the display device.
Figure 5B:
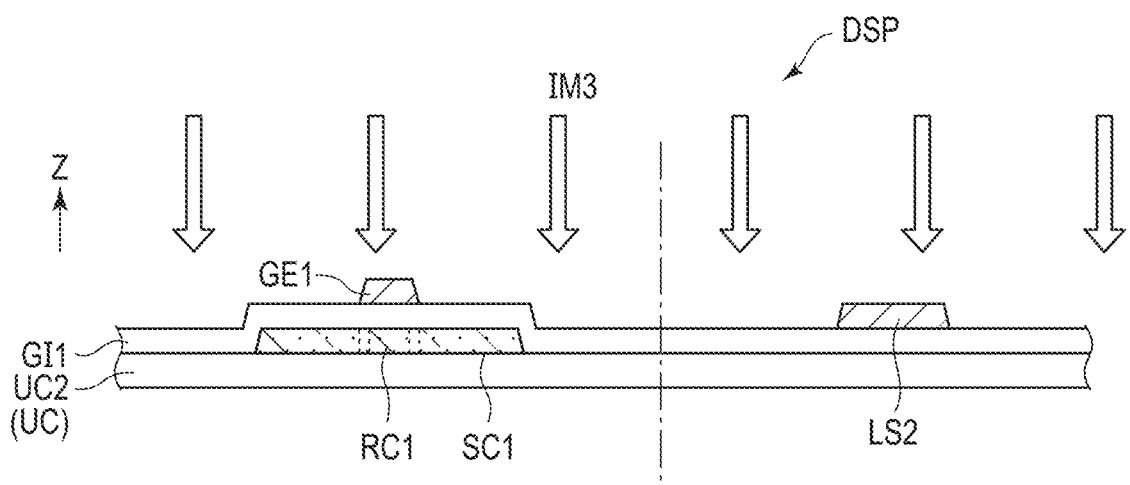
FIG. 5B is a cross-sectional view showing a process of manufacturing the display device.
Figure 5C:
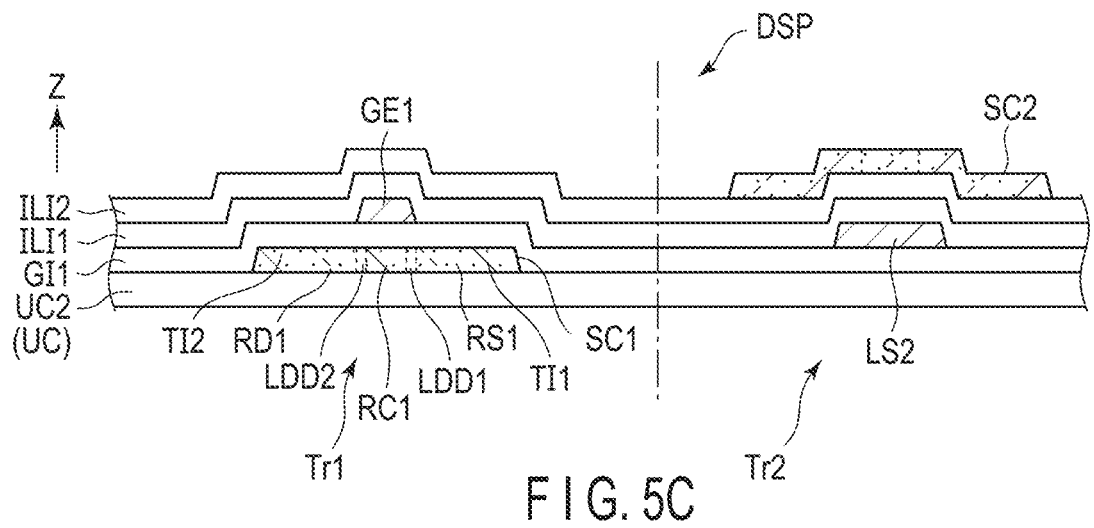
FIG. 5C is a cross-sectional view showing a process of manufacturing the display device.

FIGS. 5A to 5C are cross-sectional views showing processes of manufacturing the display device. In FIGS. 5A to 5C, the transistor Tr1 is an n-channel transistor. An insulating layer UC is formed on a base (not illustrated). A semiconductor film, which is the material of the semiconductor layer SC1, is formed on the insulating layer UC. The formed semiconductor film is then annealed by, for example, laser beams emitted thereon. Subsequently, the semiconductor film is patterned into an island shape to form the semiconductor layer SC1.

To adjust the carrier concentration of the semiconductor layer SC1, an impurity element IM2 is injected into the semiconductor layer SC1 (see FIG. 5A). The impurity element IM2 is, for example, boron. When the concentration of the impurity element IM2 in this injection process is defined as CN2, the concentration CN2 is lower than the concentration CN1. The concentration of the impurity element IM2 the semiconductor layer SC1 contains is defined as CT2. Following injection of the impurity element IM2, the insulating layer GI1 is formed to cover the semiconductor layer SC1.

On the insulating layer GI1, the gate electrode GE1 is formed to overlap a part of semiconductor layer SC1, and the light shielding layer LS2 of the transistor Tr2 is formed as well.

An impurity element IM3 is injected into the semiconductor layer SC1 through the insulating layer GI1, using the gate electrode GE1 as a mask (see FIG. 5B). The impurity element IM3 is an impurity element identical in polarity with the impurity element IM1, that is, for example, phosphorus. When the concentration of the impurity element IM3 in this injection process is defined as CN3, the concentration CN3 is lower than the concentration CN1. In the semiconductor layer SC1, a region into which the impurity element IM2 is injected but the impurity element IM3 is not injected serves as a channel forming region RC1. In other words, the channel forming region RC1 contains the impurity element IM2 but does not contain the impurity element IM3. The concentration of the impurity element IM2 in the channel forming region RC1 is the above-mentioned concentration CT2.

Following injection of the impurity element IM3, the insulating layers ILI1 and ILI2 are formed. On the insulating layer ILI2, an oxide semiconductor film, which is the material of the semiconductor layer SC2, is formed. The oxide semiconductor film is formed into an island shape, which is the semiconductor layer SC2 (see FIG. 5C).

The insulating layer GI2 is formed to cover the semiconductor layer SC2. A contact hole is formed on the insulating layers GI2, ILI2, ILI1, and GI1, the contact hole penetrating the insulating layers GI2, ILI2, ILI1, and GI1 to reach the semiconductor layer SC1.

A metal film is formed on the insulating layer GI2, the metal film being the material of the source electrode SE1a, the drain electrode DE1, and the gate electrode GE2. The metal film is connected to the semiconductor layer SC1 via contact holes. The metal film is molded into the source electrode SE1a, the drain electrode DE1, and the gate electrode GE2.

The impurity element IM1 is injected into the semiconductor layer SC1 through the source electrode SE1a and the drain electrode DE1, and into the semiconductor layer SC2 through the insulating layer GI2 (see FIG. 3). As described above, the impurity elements IM1 and IM3 are identical in polarity. The concentration CN1 of the impurity element IM1 is, however, higher than the concentration CN3 of the impurity element IM3. As a result, the source region RS1 including the region TI1 and the drain region RD1 including the region TI2 are formed in the semiconductor layer SC1 of the transistor Tr1. It should be noted that the low-concentration impurity regions LDD1 and LDD2 may be formed after formation of the insulating layer GI1, by forming a mask for low-concentration impurity region formation, using a resist, and injecting an impurity element IM5. The impurity element IM5 is, for example, phosphorus.

Similar to the region TIa2 shown in FIG. 4, a region of source electrode SE1a that is close to the interface between the semiconductor layer SC1 and the source electrode SE1a and a region of drain electrode DE1 that is close to the interface between the semiconductor layer SC1 and the drain electrode DE1 both contain the impurity element IM1.

This injection process involves defect repair at the transistor Tr2 as well, by which defects in a region of insulating layer GI2 that overlaps the gate electrode GE2 are repaired to reduce excess oxygen. At the same time, defect levels develop in a region of semiconductor layer SC2 that does not overlap the gate electrode GE2, and, consequently, the resistance of the semiconductor layer SC2 drops in this region.

Similar to the region TIa2 shown in FIG. 4, a region of gate electrode GE2 that is close to an interface between the gate electrode GE2 and the insulating layer GI2 contains the impurity element IM1. Similarly to the region TIa1, a region of insulating layer GI2 that overlaps the gate electrode GE2 and is close to the interface between the gate electrode GE2 and the insulating layer GI2 contains the impurity element IM1.

A region of insulating layer GI2 that does not overlap the gate electrode GE2 and is close to an interface between the insulating layer GI2 and the semiconductor layer SC2 contains the impurity element IM1. A region of semiconductor layer SC2 that does not overlap the gate electrode GE2 and is close to the interface between the insulating layer GI2 and the semiconductor layer SC2 contains the impurity element IM1.

As described above, in the injection process, the impurity element IM1 is injected by an applied voltage high enough to cause the impurity element IM1 to penetrate the source electrode SE1a and the drain electrode DE1. In a region where the source electrode SE1a and the drain electrode DE1 are present, the maximum concentration of the impurity element IM1 lies close to respective interfaces between the source electrode SE1a/drain electrode DE1 and the insulating layer GI2. In contrast, in the insulating layers GI2, ILI2, ILI1, and GI1 in a region where the source electrode SE1a and the drain electrode DE1 are not present, the maximum concentration of the impurity element IM1 lies at a point separated away from the interfaces with the source electrode SE1a and the drain electrode DE1 in the direction opposite to the third direction Z. In other words, the concentration of the impurity element IM1 increases in the region TIb1 located below the interfaces between the source electrode SE1a/drain electrode DE1 and the insulating layer GI2.

According to this embodiment, formation of the region TI1 of the source region RS1 and the region 112 of the drain region RD1 in the semiconductor layer SC1 of the transistor Tr1, reduction of the resistance of the source region RS2 and drain region RD2 of the semiconductor layer SC2 in the transistor Tr2, and repair of defects in the insulating layer GI2 can be performed in the same process.

The transistor Tr1 has the regions TI1 and 112 formed in the regions of semiconductor layer SC1 that are in contact with the source electrode SE1a and the drain electrode DE1, respectively. In the regions TI1 and TI2, the maximum of concentration of the impurity element IM1 lies close to the semiconductor layer SC1 and the insulating layer GI1. This suppresses an increase in contact resistance between the semiconductor layer SC1 and the source electrode SE1a and drain electrode DE1.

The example shown in FIGS. 3 and 4 has been described as an example in which the impurity elements IM1, IM3, and IM5 are impurity elements that impart n-type properties, that is, for example, phosphorus, and the impurity element IM2 for adjusting the carrier concentration of the semiconductor layer SC1 is, for example, boron. Hence the transistor Tr1, which is an n-channel transistor, can be obtained.

The impurity elements IM1, IM3, and IM5 may be impurity elements that impart p-type properties (e.g., boron). In this case, the transistor Tr1 functions as a p-channel transistor.

As described above, according to this embodiment, the reliability of the transistors Tr1 and Tr2 is improved, and therefore the display performance of the display device DSP is improved.

First Configuration Example

Figure 6:
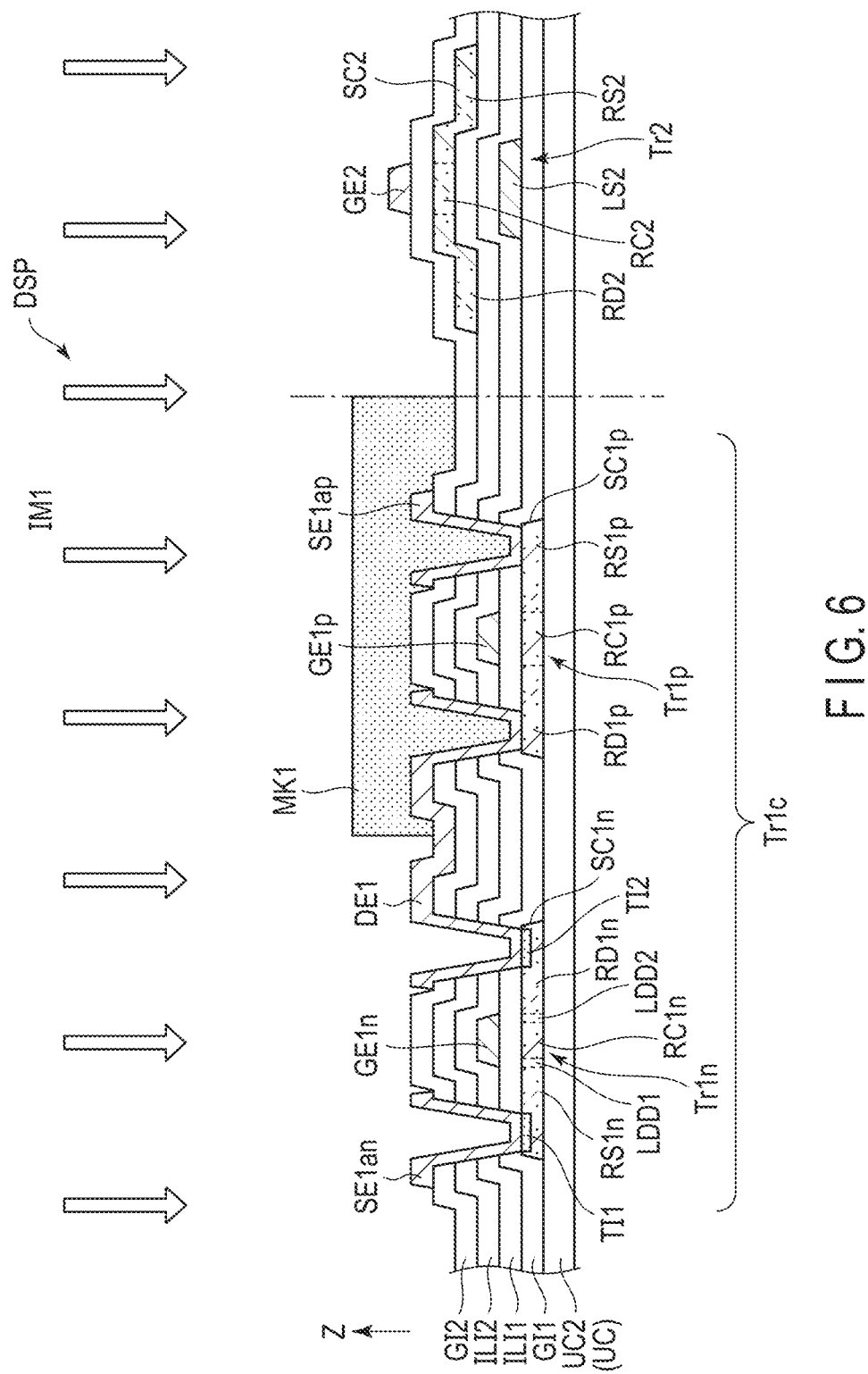
FIG. 6 is a cross-sectional view of a configuration example of the display device according to the embodiment.

FIG. 6 is a cross-sectional view of another configuration example of the display device according to the embodiment. The configuration example shown in FIG. 6 is different from the configuration example shown in FIG. 3 in that a polycrystalline silicon transistor includes an n-channel transistor and a p-channel transistor.

A display device DSP shown in FIG. 6 includes a transistor Tr1n, which is an n-channel polycrystalline silicon transistor, a transistor Tr1p, which is a p-channel polycrystalline silicon transistor, and a transistor Tr2, which is an oxide semiconductor transistor. The transistors Tr1n and Tr1p constitute a CMOS transistor Tr1c in which respective drain regions RD1n and RD1p of the transistors Tr1n and Tr1p are complementarily connected to each other via a drain electrode DE1. The transistors Tr1n and Tr1p may be independent of each other.

A semiconductor layer SC1n of the transistor Tr1n includes a channel forming region RC1n, a source region RS1n, and the drain region RD1n. A low-concentration impurity region LDD1 is provided between the channel forming region RC1n and the source region RS1n while a low-concentration impurity region LDD2 is provided between the channel forming region RC1n and the drain region RD1n. The channel forming region RC1n overlaps a gate electrode GE1n. A source electrode SE1an is provided to overlap the source region RS1n, and a drain electrode DE1 is provided to overlap the drain region RD1n.

A semiconductor layer SC1p of the transistor Tr1p includes a channel forming region RC1p, a source region RS1p, and a drain region RD1p. The channel forming region RC1p overlaps a gate electrode GE1p. A source electrode SE1ap is provided to overlap the source region RS1p, and the drain electrode DE1 is provided to overlap the drain region RD1p.

A semiconductor layer SC2 of the transistor Tr2 includes a channel forming region RC2, a source region RS2, and a drain region RD2. The channel forming region RC2 overlaps a gate electrode GE2.

Similar to the configuration example shown in FIG. 2, the transistor Tr2 has a source electrode SE2 and a drain electrode DE2 that overlap the source region RS2 and the drain region RD2 of the semiconductor layer SC2, respectively, the source electrode SE2 and drain electrode DE2 being not shown in FIG. 6.

An impurity element IM1 is the same as the impurity element IM1 described with reference to FIG. 3.

A mask MK1 will be described later.

FIGS. 7A and 7B and FIGS. 8A and 8B are cross-sectional views showing processes of manufacturing the display device.

An insulating layer UC2 (UC) is formed on a base (not illustrated). A semiconductor film, which is the material of the semiconductor layer SC1, is formed on the insulating layer UC. The formed semiconductor film is then annealed by, for example, laser beams emitted thereon. Subsequently, the semiconductor film is patterned into island shapes to form the semiconductor layers SC1n and SC1p.

An impurity element IM2 is injected into the semiconductor layers SC1n and SC1p (see FIG. 7A). The impurity element IM2 is an impurity element having a polarity opposite to that of the impurity element IM1, that is, for example, boron. When the concentration of the impurity element IM2 in this injection process is defined as CN2, the concentration CN2 is lower than the concentration CN1 of the impurity element IM1. The concentration of the impurity element IM2 in the semiconductor layers SC1n and SC1p is defined as CT1. Following injection of the impurity element IM2, an insulating layer GI1 is formed to cover the semiconductor layers SC1n and SC1p.

On the insulating layer GI1, the gate electrode GE1n is formed to overlap a part of the semiconductor layer SC1n, the gate electrode GE1p is formed to overlap a part of the semiconductor layer SC1p, and a light shielding layer LS2 of transistor Tr2 is formed.

Through the insulating layer GI1, an impurity element IM3 is injected into the semiconductor layer SC1n, using the gate electrode GE1n as a mask, and into the semiconductor layer SC1p, using the gate electrode GE1p as a mask (see FIG. 7B). The impurity element IM3 is an impurity element identical in polarity with the impurity element IM1, that is, for example, phosphorus. When the concentration of the impurity element IM3 in this injection process is defined as CN3, the concentration CN3 is lower than the concentration CN1.

In the semiconductor layer SC1n, a region into which the impurity element IM2 is injected but the impurity element IM3 is not injected serves as the channel forming region RC1n. In other words, the channel forming region RC1n contains the impurity element IM2 but does not contain the impurity element IM3. As mentioned above, the concentration of the impurity element IM2 in the channel forming region RC1n is the concentration CT1.

In the semiconductor layer SC1p, a region into which the impurity element IM2 is injected but the impurity element IM3 is not injected serves as the channel forming region RC1p. In other words, the channel forming region RC1p contains the impurity element IM2 but does not contain the impurity element IM3. As mentioned above, the concentration of the impurity element IM2 in the channel forming region RC1p is the concentration CT1.

It should be noted that, in the injection process, the impurity element IM3 may not be injected into the semiconductor layer SC1p. In such a case, a mask covering the semiconductor layer SC1p is formed so that the impurity element IM3 is not injected into the semiconductor layer SC1p.

Following injection of the impurity element IM3, a mask MK2 is formed to cover the semiconductor layer SC1n and the gate electrode GE1n. Subsequently, an impurity element IM4 of a concentration CN4 is injected into the semiconductor layer SC1p (see FIG. 8A). The impurity element IM4 is injected into the semiconductor layer SC1p, using the gate electrode GE1p as a mask. The impurity element IM4 is an impurity element having a polarity opposite to that of the impurity element IM1, that is, for example, boron. In this process, the concentration CN4 is higher than the concentration CN3.

When the impurity element IM3 is already injected in the semiconductor layer SC1p, injection of the impurity element IM4 into the semiconductor layer SC1p reverses the polarity of the region of semiconductor layer SC1p that does not include the channel forming region RC1p, thus forming the source region RS1p and the drain region RD1p. Even when the impurity element IM3 is not injected in the semiconductor layer SC1p, injection of the impurity element IM4 forms the source region RS1p and the drain region RD1p in the same manner.

Following injection of the impurity element IM4, insulating layers ILI1 and ILI2 are formed. On the insulating layer ILI2, an oxide semiconductor film, which is the material of the semiconductor layer SC2, is formed. The oxide semiconductor film is patterned into an island shape, which is the semiconductor layer SC2 (see FIG. 8B).

The insulating layer GI2 is formed to cover the semiconductor layer SC2. Contact holes are formed on the insulating layers GI2, ILI2, ILI1, and GI1, the contact holes penetrating the insulating layers GI2, ILI2, ILI1, and GI1 to reach the semiconductor layers SC1n and SC1p, respectively.

A metal film is formed on the insulating layer GI2, the metal film being the material of the source electrode SE1an, the drain electrode DE1, the source electrode SE1ap, and the gate electrode GE2. The metal film is connected to the semiconductor layers SC1n and SC1p via contact holes. The metal film is molded into the source electrode SE1an, the drain electrode DE1, the source electrode SE1ap, and the gate electrode GE2.

The mask MK1 is formed to cover the semiconductor layer SC1p, the gate electrode GE1p, the source electrode SE1ap, and a part of the drain electrode DE1. Subsequently, the impurity element IM1 of the concentration CN1 is injected into the semiconductor layer SC1n through the source electrode SE1an and the drain electrode DE1, into the insulating layer GI2 through the gate electrode GE2, and, in a part where the gate electrode GE2 does not present, into the semiconductor layer SC2 through the insulating layer GI2 (see FIG. 6). As described above, the impurity elements IM1 and IM3 are identical in polarity. The concentration CN1 of the impurity element IM1 is, however, higher than the concentration CN3 of the impurity element IM3.

As a result, the source region RS1n including the region TI1 and the drain region RD1n including the region TI2 are formed in the semiconductor layer SC1n of the transistor Tr1n. In the same manner as in the process descried with reference to FIG. 3, the low-concentration impurity regions LDD1 and LDD2 may be formed after formation of the insulating layer GI1, by forming a mask for low-concentration impurity region formation, using a resist, and injecting an impurity element IM5.

The above process of injecting the impurity element IM1 involves defect repair at the transistor Tr2 as well, by which defects in the insulating layer GI2 are repaired to reduce excess oxygen. At the same time, defect levels develop in the semiconductor layer SC2, which is an oxide semiconductor layer, and, consequently, the resistance of the semiconductor layer SC2 drops.

According to this configuration example, the reliability of the transistors Tr1n, Tr1p, and Tr2 is improved, and therefore the display performance of the display device DSP is improved.

This configuration example offers the same effects as the embodiment offers.

In this specification, the transistors Tr1 and Tr2 are referred to also as a first transistor and a second transistor, respectively. The transistors Tr1n, Tr1p, and Tr2 are referred to also as a first transistor, a second transistor, and a third transistor, respectively.

As mentioned above, the semiconductor layers SC1 and SC2 are referred to also as a first semiconductor layer and a second semiconductor layer, respectively. The semiconductor layers SC1 and SC2 are also referred to as a polycrystalline silicon layer and an oxide semiconductor layer, respectively. The semiconductor layers SC1n, SC2, and SC1p are referred to also as a first semiconductor layer, a second semiconductor layer, and a third semiconductor layer, respectively. The semiconductor layers SC1n, SC1p, and SC2 are referred to also as a first polycrystalline silicon layer, a second polycrystalline silicon layer, and an oxide semiconductor layer, respectively.

The regions TI1 and TI2 are referred to also as a first region and a second region, respectively.

The insulating layers GI1 and GI2 are referred to also as a first insulating layer and a second insulating layer, respectively. The insulating layer ILI2 is referred to also as a third insulating layer.

The impurity element IM1 is referred to also as a first impurity element, and an impurity element imparting a polarity opposite to that of the impurity element IM1, for example, the impurity element IM4 is referred to also as a second impurity element.

According to the order of injection of impurity elements, the impurity elements IM2, IM3, and IM1 are referred to also as a first impurity element, a second impurity element, and a third impurity element. The impurity elements IM2, IM3, IM4, and IM1 are referred to also as a first impurity element, a second impurity element, a third impurity element, and a fourth impurity element.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
a display area provided with a plurality of pixels;
a non-display area provided with a drive circuit that drives the pixels;
a first transistor provided in the drive circuit, the first transistor including a first semiconductor layer, a first gate electrode, a first insulating layer provided between the first semiconductor layer and the first gate electrode, a first source electrode, and a first drain electrode;
a second transistor provided in each of the pixels, the second transistor including a second semiconductor layer, a second gate electrode, a second insulating layer provided between the second semiconductor layer and the second gate electrode, a second source electrode, and a second drain electrode; and
a third insulating layer,
wherein
the first semiconductor layer is formed of polycrystalline silicon, and the second semiconductor layer is formed of an oxide semiconductor layer,
the first semiconductor layer includes a first channel forming region overlapping the first gate electrode, a first source region, a first drain region,
the first source region includes a first region being in contact with the first source electrode, and the first drain region includes a second region being in contact with the first drain electrode,
the first source region, the first drain region, the first region, and the second region each include a first impurity element that imparts polarity,
in a region close to an interface between the first semiconductor layer and the first insulating layer, a concentration of the first impurity element included in the first region and the second region is higher than a concentration of the first impurity element included in the first source region and the first drain region,
the second semiconductor layer is disposed between the second insulating layer and the third insulating layer,
the second insulating layer and the third insulating layer are formed of silicon oxide, and
the second insulating layer and the third insulating layer each include the first impurity element.

2. The display device according to claim 1, wherein the first source electrode and the first drain electrode each include the first impurity element.

3. The display device according to claim 1, wherein the second gate electrode includes the first impurity element.

4. The display device according to claim 1, further comprising a third transistor, wherein
the third transistor is provided in the drive circuit, the third transistor including a third semiconductor layer, a third gate electrode, the first insulating layer provided between the third semiconductor layer and the third gate electrode, a third source electrode, and a third drain electrode,
the third semiconductor layer includes a third channel forming region overlapping the third gate electrode, a third source region, and a third drain region, the third semiconductor layer is formed of polycrystalline silicon, and
the third source region and the third drain region each include a second impurity element that imparts a polarity opposite to a polarity of the first impurity element.

5. A display device comprising:
a display area provided with a plurality of pixels;
a non-display area provided with a drive circuit that drives the pixels;
a first transistor provided in the drive circuit, the first transistor including a first semiconductor layer, a first gate electrode, a first insulating layer provided between the first semiconductor layer and the first gate electrode, a first source electrode, and a first drain electrode;
a second transistor provided in each of the pixels, the second transistor including a second semiconductor layer, a second gate electrode, a second insulating layer provided between the second semiconductor layer and the second gate electrode, a second source electrode, and a second drain electrode; and
a third insulating layer provided between the first gate electrode and the second semiconductor layer,
wherein
the first semiconductor layer is formed of polycrystalline silicon, and the second semiconductor layer is formed of an oxide semiconductor layer,
the first semiconductor layer includes a first channel forming region overlapping the first gate electrode, a first source region, a first drain region,
the first source region includes a first region being in contact with the first source electrode, and the first drain region includes a second region being in contact with the first drain electrode, and
the first source region, the first drain region, the first region, the second region, the second semiconductor layer, the first source electrode, the first drain electrode, the second insulating layer, and the third insulating layer each include a first impurity element that imparts polarity.

6. The display device according to claim 5, wherein the second insulating layer and the third insulating layer are formed of silicon oxide.

7. The display device according to claim 5, further comprising a third transistor, wherein
the third transistor is provided in the drive circuit, the third transistor including a third semiconductor layer, a third gate electrode, the first insulating layer provided between the third semiconductor layer and the third gate electrode, a third source electrode, and a third drain electrode,
the third semiconductor layer includes a third channel forming region overlapping the third gate electrode, a third source region, and a third drain region,
the third semiconductor layer is formed of polycrystalline silicon, and wherein
the third source region and the third drain region each include a second impurity element that imparts a polarity opposite to a polarity of the first impurity element.

8. A manufacturing method for a display device, the manufacturing method comprising:
forming a first semiconductor layer;
injecting a first impurity element into the first semiconductor layer;
forming a first insulating layer on the first semiconductor layer into which the first impurity element is injected;

forming a first gate electrode and a light shielding layer on the first insulating layer such that the first gate electrode overlaps a part of the first semiconductor layer;

injecting a second impurity element into the first semiconductor layer, using the first gate electrode as a mask;

forming a second insulating layer such that the second insulating layer covers the first gate electrode, the light shielding layer, and the first insulating layer;

forming a second semiconductor layer on the light shielding layer, with the second insulating layer interposed between the light shielding layer and the second semiconductor layer;

forming a third insulating layer on the second semiconductor layer and the second insulating layer;

forming a first source electrode, a first drain electrode, and a second gate electrode on the third insulating layer, the first source electrode and the first drain electrode being in contact with the first semiconductor layer and the second gate electrode overlapping a part of the second semiconductor layer; and injecting a third impurity element into the first semiconductor layer through the first source electrode and the first drain electrode to form a first region and a second region in the first semiconductor layer.

* * * * *